United States Patent
Ren et al.

(10) Patent No.: US 6,914,273 B2
(45) Date of Patent: Jul. 5, 2005

(54) GAN-TYPE ENHANCEMENT MOSFET USING HETERO STRUCTURE

(75) Inventors: Fan Ren, Gainesville, FL (US); Cammy Rene Abernathy, Gainesville, FL (US); Stephen J. Pearton, Gainesville, FL (US); Yoshihiro Irokawa, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 10/649,712

(22) Filed: Aug. 26, 2003

(65) Prior Publication Data

US 2004/0041169 A1 Mar. 4, 2004

Related U.S. Application Data

(60) Provisional application No. 60/405,964, filed on Aug. 26, 2002.

(51) Int. Cl.[7] ............................................. H01L 29/778
(52) U.S. Cl. ....................................... 257/194; 257/192
(58) Field of Search ................................ 257/194, 192

(56) References Cited

U.S. PATENT DOCUMENTS

| | | | |
|---|---|---|---|
| 5,929,467 A | 7/1999 | Kawai et al. | |
| 6,107,649 A | 8/2000 | Zhao | |
| 6,140,169 A | * 10/2000 | Kawai et al. | ................ 438/197 |
| 6,429,467 B1 | 8/2002 | Ando | |
| 6,469,357 B1 | * 10/2002 | Hong et al. | .................. 257/410 |
| 6,593,194 B2 | * 7/2003 | Kolodzey et al. | ............ 438/287 |
| 2001/0015437 A1 | 8/2001 | Ishii et al. | |
| 2002/0052076 A1 | 5/2002 | Khan et al. | |

OTHER PUBLICATIONS

Hu et al., "Enhancement mode AlGaN/GaN HFET with selectively grown pn junction gate," Electronics Letters, 36: 753–754, 2000.

Chen et al., "GaN Metal–insulator–semiconductor Field Effect Transistor Based on GaN/AlGaN Double Hetrojunctions," Nanjing University, P.R. China.

Yoshida, S. , Abstrat, "AlGaN/GaN Power FET," Furukawa Review, 21: 7–11, 2002.

(Continued)

Primary Examiner—Jerome Jackson
(74) Attorney, Agent, or Firm—Akerman Senterfitt

(57) ABSTRACT

A GaN based enhancement mode MOSFET includes a GaN layer and a (Group III)$_x$Ga$_{1-x}$N layer, such as an Al$_x$Ga$_{1-x}$N disposed on the GaN layer. The thickness of the Al$_x$Ga$_{1-x}$N layer is less than 20 nm to provide a negligible sheet carrier concentration in the GaN layer along its interface with Al$_x$Ga$_{1-x}$N. A source and a drain region extend through the Al$_x$Ga$_{1-x}$N layer into the GaN layer, the source and drain region separated by a channel region. A gate dielectric is disposed over the channel region. A gate electrode is disposed on the gate dielectric. The MOSFET formed is a true enhancement MOSFET which is in an off state when the gate is unbiased.

16 Claims, 2 Drawing Sheets

OTHER PUBLICATIONS

Valizadeh, P., Abstrat, AlxGa 1–XN/GaN High Electron Mobility Transistor (HEMT).

Kim et al., "Characteristics of MgO/GaN gate–controlled metal–oxide–semiconductor diodes, " Applied Physics Letter, 80: 4555–4557, Jun. 2002.

Simin et al., "7.5kW/mm2 current switch using AlGaN/GaN metal–oxide–semiconductor heterostructure filed effect transistor on SIC substrates," Electronics Letters, 36: Nov. 2000.

Mistele et al., "First AlGaN/GaN MOSFET with photoanodic gate dielectric," Materials Science and Engineering, B93, 107–111, 2002.

Khan et al., "Enhancement and depletion mode GaN/AlGaN hetrostructure field effect transistors, " Appl. Phys. Lett., 68: 514–516, Jan. 1996.

Simin, et al., "SiO2/AlGaN/InGaN/GaN MOSDHFETs," IEEE Electron Device Letters, 23: 458–460, Aug. 2002.

Kim et al., "Characteristics of MgO/GaN gate–controlled metal–oxide–semiconductor diodes, 38 Applied Physics Letter, 80: 4555–4557, Jun. 2002.

Koudymov et al., "Maximum current in nitride–based hetrostructure field–effect transistors," Applied Physics Letters, 80: 3216–3218, Apr. 2002.

Hu et al., "Si3N4/AlGaN–metal–insulator–semiconductor hetrostructure field–effect transistors," Applied Physics Letters, 79: 2832–2834, Oct. 2001.

Teles et al., "Spinodal decomposition in BxGa1–xN and BxAl1–xN alloys," Applied Physics Letters, 80: 1177–1179, Feb. 2002.

Chou et al., AlGaN/GaN Metal Oxide Semiconductor Hetrostructure Field–Effect Transistor Based on a Liquid Phase Deposited Oxide, Jpn. J. Appl. Phys. 41: L748–l750, Jul. 2002.

* cited by examiner

GAN-TYPE ENHANCEMENT MOSFET USING HETERO STRUCTURE

CROSS-REFERENCE TO RELATED APPLICATIONS

This application claims the benefit of U.S. Provisional Application No. 60/405,964 entitled "GaN-TYPE ENHANCEMENT MOSFET USING HETERO STRUCTURE" filed on Aug. 26, 2002, the entirety of which is incorporated herein by reference.

STATEMENT REGARDING FEDERALLY SPONSORED RESEARCH OR DEVELOPMENT

The United States Government has rights in this invention pursuant to Grant No. N00014 99 1 0204 between the Office of Naval Research and the University of Florida.

FIELD OF THE INVENTION

The invention relates to an enhancement mode metal oxide semiconductor field effect transistor (MOSFET) formed from a Group-III nitride compound semiconductor.

BACKGROUND

Historically, device performance improvements have been achieved by scaling. However, fundamental limits to device scaling are being reached and problems related to scaling are becoming more significant. Currently, Si-based power devices are generally used in high power electronic devices. However, their performance has almost reached the value predicted by theory and can no longer be significantly improved. Accordingly, alternative devices based on different substrates capable of providing improved performance have been under investigation.

One area that still has not been fully exploited is the engineering of substrates to achieve higher carrier mobility. Gallium nitride (GaN), which is a Group-III nitride compound semiconductor, has a large forbidden band gap, equal to about 3.4 eV. The indirect transition conduction band is positioned at a level higher than the forbidden band by more than 1.5 eV. The saturation velocity of GaN is approximately $2.5. \times 10^7$ cm/s, which is higher than other types of semiconductors, such as silicon (Si), gallium arsenide (GaAs), and silicon carbide (SiC). Further, the breakdown electric field of GaN is approximately $5 \times 10^6$ V/cm, which is greater than SiC, and greater than Si and GaAs by more than one order of magnitude. Thus, GaN has physical characteristics that are suitable for use in high-frequency, high-temperature, and high-power semiconductor devices.

A conventional FET using GaN is a Schottkey gate transistor having a metal semiconductor (MES) structure. An n-type GaN active layer is formed on a sapphire substrate with an intrinsic-GaN buffer layer therebetween. A gate electrode, a source electrode, and a drain electrode are disposed on the active layer.

An alternate Schottkey gate FET structure, referred to as a high electron mobility transistor (HEMT) structure, includes an electron transit layer made from impurity-undoped GaN and an electron supply layer made from n-type AlGaN which are sequentially laminated on a substrate, such as a sapphire substrate. A gate electrode is formed on the electron supply layer, and a source electrode and a drain electrode are disposed on the electron transit layer on both sides of the electron supply layer.

In another example of known GaN based FETs having the HEMT structure, the thickness of the AlGaN electron supply layer is decreased, thereby making the threshold gate voltage around 0 V. This type of FET is referred to as a "enhancement-mode FET", but is not a true enhancement mode FET as it does not require a positive gate voltage to turn on.

In the foregoing MES or HEMT-structured FETs, the Schottky barrier at the gate electrode between a metal and the semiconductor is comparatively low, such as approximately from 1 to 1.2 eV. Although this Schottky barrier is slightly greater than that of the GaAs-type FETs (0.7 eV), a large forward gate bias voltage cannot be applied. This shortcoming originates from the operation of the MES-structured FET rather than from the constituent material, such as GaN.

In contrast, large forward gate bias voltages are possible from a conventional metal-oxide-semiconductor field effect transistor (MOSFET), where the substrate generally used is silicon. In this type of FET, a gate electrode is formed on a Si layer with a silicon oxide ($SiO_2$) film therebetween. The silicon dioxide film provides a highly electrically insulating film. For enhancement-type MOSFETs, an inversion layer is formed at the Si interface between the $SiO_2$ film and the Si layer through application of a sufficient gate to body (or source) voltage.

N-channel GaN based depletion MOSFETs of MOSHEMTs have been realized without the need for impurity doping in the channel region. AlGaN/GaN heterojunctions experience large piezoelectric effects which generate a large interface charge. The large interface charge can induce an electron sheet in the GaN near its interface with AlGaN.

Some have disclosed GaN based depletion mode MOSFETs. Some have even claimed to disclose "enhancement mode GaN based MOSFETs". However, the disclosed "enhancement mode GaN based MOSFET" devices are not truly enhancement mode devices since an enhancement MOSFET is characterized as a MOS device which forms a channel only when the gate to body (or source) voltage exceeds some threshold voltage. Accordingly, there is a need for true GaN based enhancement mode MOSFETs.

SUMMARY OF THE INVENTION

A GaN-based enhancement mode MOSFET includes a GaN comprising layer and a (Group III)$xGa_{1-x}$N layer, where x is from 0 to 1, such as $Al_xGa_{1-x}$N, disposed on the GaN comprising layer. Although the Group III element will be referred to herein as being Al, the group III element can be other Group III species, such as B, or mixtures thereof.

The thickness of the AlxGa$_{1-x}$N layer is less than 20 nm. This provides negligible sheet carrier concentration in the GaN layer at its interface with $Al_xGa_{1-x}$N to permit enhancement mode operation. Typically, at some $Al_xGa_{1-x}$N thickness value from 10 to about 20 nm, the device will become a depletion mode device for any thickness above this value.

A source and a drain region extend through the $Al_xGa_{1-x}$N layer into the GaN layer, the source and drain region separated by a channel region. A gate dielectric is disposed over the channel region. The gate dielectric layer can be $SiN_x$, MgO or $Sc_2O_3$. A gate electrode is disposed on the gate dielectric. The MOSFET formed is a true enhancement MOSFET which is in an off-state when the gate is unbiased.

The parameter x is preferably from 0.2 to 0.35. The enhancement MOSFET can be either an n-channel or a p-channel device.

The $Al_xGa_{1-x}$N layer can be undoped or p-doped. The thickness of the $Al_xGa_{1-x}$N layer can be less than 10 nm, less than 5 nm, or more preferably from 1 to 4 nm thick.

The GaN comprising layer can be p-GaN, undoped GaN or InGaN. In one embodiment of the invention, a p-AlGaN or undoped AlGaN layer can be disposed below the GaN comprising layer.

BRIEF DESCRIPTION OF THE DRAWINGS

A fuller understanding of the present invention and the features and benefits thereof will be accomplished upon review of the following detailed description together with the accompanying drawings, in which.

DETAILED DESCRIPTION OF THE INVENTION

A GaN-based enhancement mode MOSFET includes a GaN comprising layer and a (Group III)$_x$Ga$_{1-x}$N layer disposed on the GaN layer, where x is between 0 and 1. As noted earlier, although the Group III element will be referred to herein as being Al, the group III element can be other Group III species, such as B, or mixtures thereof.

The thickness of the Al$_x$Ga$_{1-x}$N layer to provide enhancement mode operation is below a certain thickness. By providing a Al$_x$Ga$_{1-x}$N layer thickness of approximately 20 nm or less, such as 10 nm, preferably less than 5 nm, and more preferably from 1–4 nm, negligible sheet carrier concentration in the GaN layer at its interface with Al$_x$Ga$_{1-x}$N results. Accordingly, the surface of the GaN adjacent to the Al$_x$Ga$_{1-x}$N layer can be rendered undoped or even p-type. A source and a drain region each extend through the Al$_x$Ga$_{1-x}$N layer into the GaN layer, the source and drain region separated by a channel region.

A gate dielectric is disposed over the channel region. A gate electrode is disposed on the gate dielectric. The MOSFET formed is a true enhancement MOSFET which is in an off state when the gate is unbiased.

Regarding the composition of the Al$_x$Ga$_{1-x}$N layer, x can be from 0.05 to 1.0. Preferably, x ranges from 0.2 to 0.35.

The invention can be used to produce a true enhancement mode GaN based MOSFET. Thus, the invention provides at least two significant advantages as compared to conventional MOSFETs. First, the thin AlGaN surface layer can protect the GaN channel from being damaged during the deposition of the gate oxide layer. This leads to higher carrier mobility in the GaN layer. Second, the transistor structure forms a GaN quantum well at AlGaN/GaN interface, which can provide better carrier confinement, improved carrier mobility and carrier concentration.

The invention can be embodied as either a p-channel or n-channel MOSFET. In the case of an n-channel MOSFET, an epitaxial layer stack comprising p-type or undoped AlGaN and GaN can be used. To form a p-channel MOSFET, an epitaxial layer stack comprising n-type or undoped AlGaN and GaN can be used. Thus, using undoped base epi, both n-channel MOSFETs and p-channel MOSFETs can formed using the same epitaxial layer stack. When non-complementary structures are not required for a given application, the invention is preferably embodied using n-channel MOSFETs due to their improved performance as compared to p-channel MOSFETs.

Figure 1:
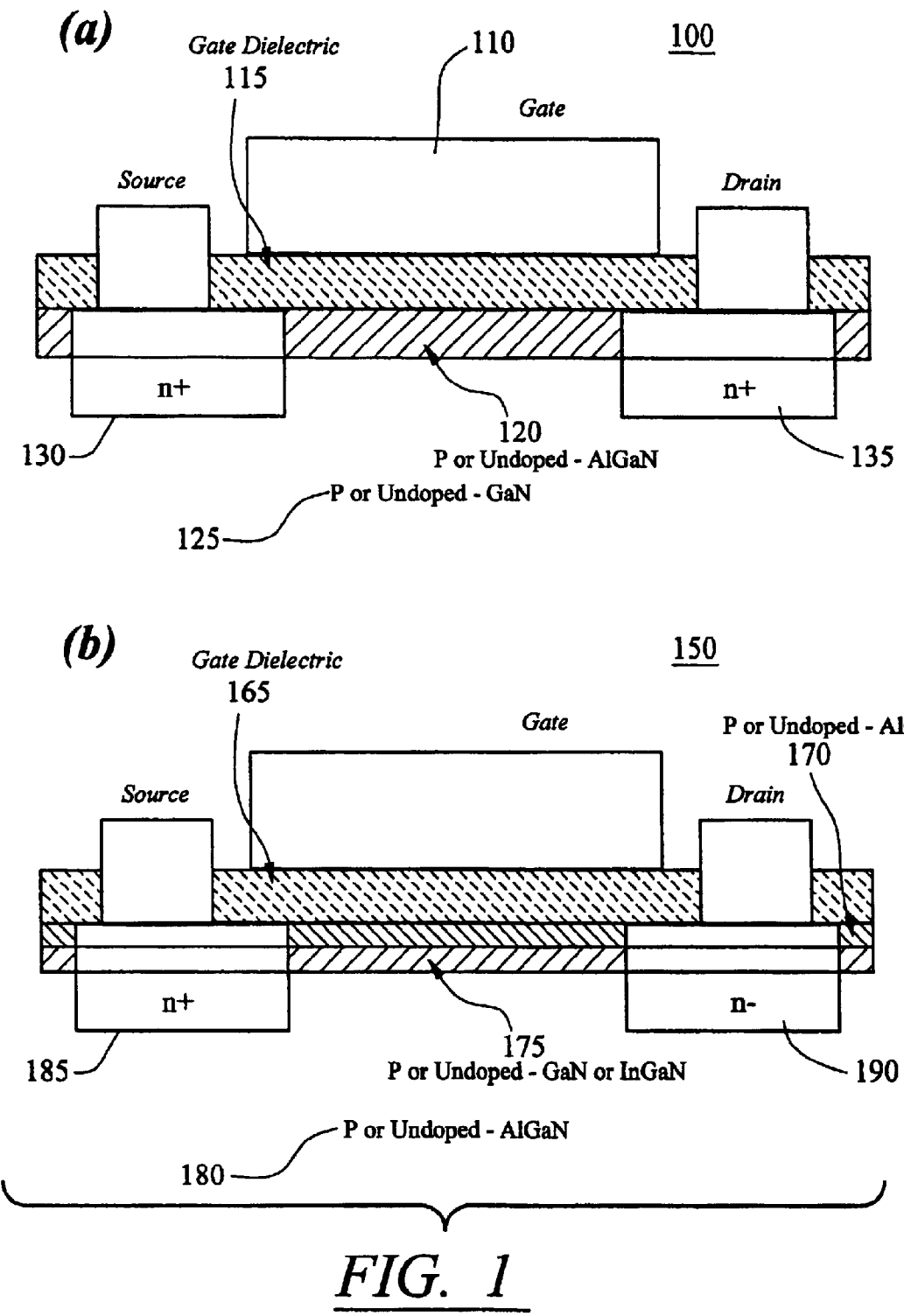
FIG. 1(a) illustrates an n-channel GaN based enhancement mode MOSFET according to an embodiment of the invention.
FIG. 1(b) illustrates an n-channel GaN based enhancement mode MOSFET according to an alternate embodiment of the invention.

Two exemplary embodiments of n-channel enhancement MOSFETs according to the invention are shown in FIGS. 1(a) and 1(b), respectively. Referring to FIG. 1(a), transistor 100 includes gate electrode 110 disposed on gate dielectric layer 115. Gate dielectric layer 115 can be any suitable dielectric, such as SiO$_2$, SiNx, MgO or Sc$_2$O$_3$. Gate dielectric layer 115 is disposed on a thin layer of p-type or undoped AlGaN 120. It may be possible to replace the Al in layer 120 with certain group III elements, such as boron.

The thin AlGaN layer 120 is disposed on a p-type or undoped GaN layer 125 to form a vertical heterostructure. Although not described in detail herein, the invention can also be used to form vertical MOSFETs. In a vertical MOSFET, the gate and source contacts are on the front of the substrate the drain is located on the back side of the substrate. The advantage of vertical MOSFETs is that the breakdown voltage from drain to source can be extremely high since the drift region for the vertical MOSFET is the entire thickness of the substrate.

Transistor 100 also comprises n+ source 130 and n+ drain 135 regions. The depth of regions 130 and 135 is preferably 300 to 400 nm. For example, Si or Ge can be used as the n dopant. The thickness of the AlGaN layer 120 can be from about 0.5 nm to about 20 nm, preferably being about 4 to 5 nm.

However, if a p-AlGaN layer 120 thicker than about 10 nm is used, the device performance will generally be degraded as compared to a thinner p-AlGaN layer 120 due to longer distance between the gate 110 and the inversion channel (not shown). If the p-AlGaN layer 120 comprises a thick undoped AlGaN layer, such as >20 nm, an n-channel will generally be formed at the AlGaN/GaN interface due to the piezoelectric effect. This will result in the formation of a depletion mode n-channel MOSFET device.

To form a p-channel enhancement mode MOSFETs, the steps described above for forming an n-channel MOSFET can generally be repeated, except an undoped or n-type AlGaN and GaN layer stack is provided, rather than p- or undoped AlGaN and GaN. For example, n-type GaN can comprise Si-doped GaN. P+ source and drain regions, such as magnesium doped regions, are then formed in the AlGaN/GaN layer stack, such as through ion implantation of Mg or selective area re-growth of Mg-doped GaN.

Transistor 100 provides a heterojunction layer between AlGaN layer 120 and GaN layer 125. Since AlN has a band gap of about 6.4 eV which is almost double as compared to GaN (about 3.3 eV), AlGaN can be appropriately treated as an insulator as compared to the GaN layer. Therefore, transistor 100 can form both a first inversion layer at the surface of AlGaN layer 120 adjacent to gate dielectric layer 115, as well as a second inversion layer in the GaN layer 125 near the AlGaN/GaN interface. Since GaN has lower energy band gap, the inversion channel in the GaN layer 125 at the AlGaN/GaN interface will be at a lower threshold voltage as compared to the first inversion layer formed at the surface of AlGaN layer 120 adjacent to gate dielectric layer 115.

An alternate embodiment of an n-channel enhancement mode transistor 150 is shown in FIG. 1(b). Transistor 150 includes gate electrode 160, disposed on gate dielectric layer 165, which is disposed on a thin layer of p-type or un-doped AlGaN 170. The AlGaN layer is disposed on a layer of InGaN 175, which is disposed on a layer of AlGaN 180. Thus, transistor 150 includes two vertical heterostructures.

Transistor 150 includes n+ source 185 and drain 190 regions. The depth of regions 185 and 190 is preferably from about 300 to 400 nm.

Figure 2:
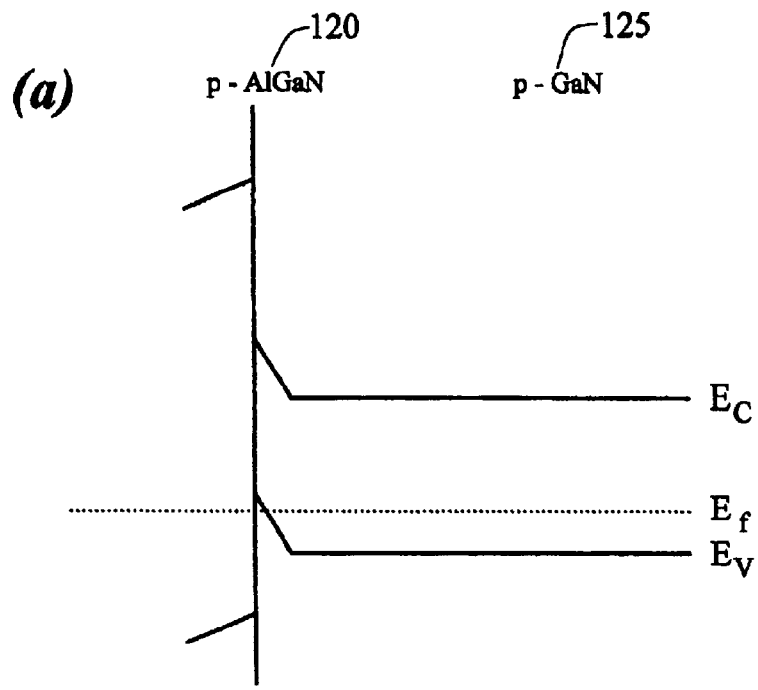
FIG. 2(a) illustrates the band-structure for the p-AlGaN/GaN heterojunctions for the AlGaN/GaN MOSFET transistors shown in FIGS. 1(a) and 1(b) with no applied voltage to the gate.
FIG. 2(b) illustrates the band-structure for the p-AlGaN/GaN heterojunctions for the AlGaN/GaN MOSFET transistors shown in FIGS. 1(a) and 1(b) evidencing two inversion channels.
Figure 2:
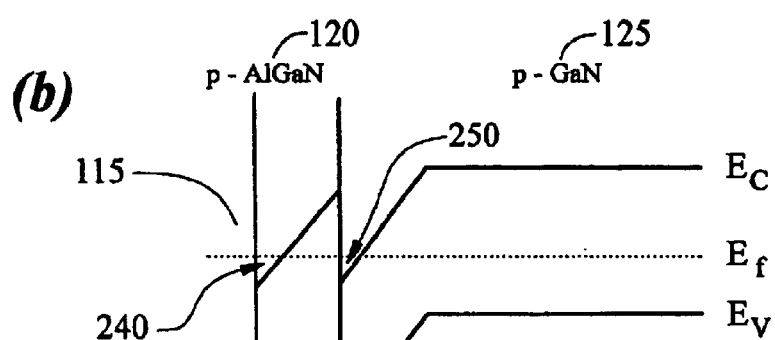

FIG. 2(a) shows the band-structure for the p-AlGaN/GaN heterojunctions for the AlGaN/GaN MOSFET transistors shown in FIGS. 1(a) and 1(b) with no applied voltage to the gate. In this state, no n-channel exists in both the AlGaN 120 and GaN layer 125 since the conduction band edge ($E_c$) is above the Fermi level ($E_f$) for both layers. Thus, assuming the device does not punchthrough from source to drain, negligible current will flow between the source and drain even if a large voltage is imposed between the source and the drain. Thus, the device formed is clearly a true enhancement mode device.

As the gate to source voltage of n-channel enhancement mode transistor 100 or 150 is increased to some positive ("threshold") voltage above the source or body voltage, an inversion channel 250 between the AlGaN layer 120 and the GaN layer 125 will generally be first induced. As the gate voltage is further increased, a second inversion channel 240 at the interface between the gate dielectric 115 and the AlGaN layer 120 is generally also induced, thus providing two inversion n-channels. FIG. 2(b) shows the band structure following application of a sufficiently positive voltage to the gate relative to the source or body of the device to create n-channels 240 and 250. As a result of the band structure shown in FIG. 2(b), electrons can easily flow between the source and drain upon application of a voltage between the source and drain. With the gate voltage removed, no channel is present and the device is in an off state. Thus, devices according to the invention can provide a normally-off, enhancement mode power MOSFET.

The invention can find applications in inverter systems, analogous to a standard Si based CMOS inverter layouts for use in high power electronics. Significantly, the invention can generally be operated at high temperature without a cooling system, because GaN is a wide band gap semiconductor and the switching loss of the enhancement mode FETs according to the invention is low. Enhancement mode devices use less power as compared to depletion mode devices because enhancement mode devices, unlike depletion mode devices, generally consume little or no power during stand-by mode. Thus, the invention can reduce switching loss.

The invention may also provide improved breakdown voltages as compared to other available structures. A voltage across a gate of a MOSFET produces an electrical field which is distributed through the oxide and semiconductor, the magnitude of which is proportional to the dielectric constant of the oxide. The dielectric constant of MgO and $Sc_2O_3$ which can be used for the gate oxide 115, are much higher than that of $SiO_2$. Accordingly, the gate to source or body breakdown voltage of the GaN MOSFET should be higher as compared to a GaN MESFET or a Si-MOSFET. Also, the use of high dielectric constant oxide layers permit use of thinner oxide layers. This arrangement provides higher drain current and transconductance.

An ideal market for the invention is for high power electronics devices. For example, for automobile applications where circuits must withstand a high temperature environment without additional cooling systems, such as beyond the capabilities of Si-based technology (e.g. >200° C.) or more, the invention can be particularly useful.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

We claim:

1. A GaN based enhancement mode MOSFET, comprising:
   a GaN comprising layer;
   a (Group III)$_x$Ga$_{1-x}$N layer, where x is from 0 to 1, disposed on said GaN layer, a thickness of said (Group III)$_x$Ga$_{1-x}$N layer being less than 20 nm;
   a doped semiconductor source and a doped semiconductor drain extending through said (Group III)$_x$Ga$_{1-x}$N layer into said GaN layer, said source and drain separated by a channel region comprising said (Group III)$_x$Ga$_{1-x}$N layer and said GaN layer, wherein a first p-n junction is formed where said source contacts said channel region and a second p-n junction is formed where said drain contacts said channel region;
   a gate dielectric layer disposed over said channel region, and
   a gate electrode overlapping said source and said drain disposed on said gate dielectric, wherein said MOSFET is in an off-state when said gate is not biased.

2. The transistor of claim 1, wherein said Group III element comprises Al.

3. The transistor of claim 1, wherein x is from 0.2 to 0.35.

4. The transistor of claim 1, wherein said Group III element comprises B.

5. The transistor of claim 1, wherein MOSFET is an n-channel MOSFET.

6. The transistor of claim 1, wherein MOSFET is a p-channel MOSFET.

7. The transistor of claim 1, wherein said (Group III)$_x$Ga$_{1-x}$N layer is undoped.

8. The transistor of claim 1, wherein said (Group III)$_x$Ga$_{1-x}$N layer is p-doped.

9. The transistor of claim 1, wherein said thickness of said (Group III)$_x$Ga$_{1-x}$N layer is less than 10 nm thick.

10. The transistor of claim 1, wherein said thickness of said (Group III)$_x$Ga$_{1-x}$N layer is less than 5 nm thick.

11. The transistor of claim 1, wherein said thickness of said (Group III)$_x$Ga$_{1-x}$N layer is 1 to 4 nm thick.

12. The transistor of claim 1, wherein said GaN comprising layer is selected from the group consisting of p-GaN, undoped GaN and InGaN.

13. The transistor of claim 1, further comprising a p-AlGaN or undoped AlGaN layer disposed below said GaN comprising layer.

14. The transistor of claim 1, wherein said gate dielectric layer comprises SiN$_x$.

15. The transistor of claim 1, wherein said gate dielectric layer comprises MgO.

16. The transistor of claim 1, wherein said gate dielectric layer comprises $Sc_2O_3$.

* * * * *